(12) United States Patent
Vandentop et al.

(10) Patent No.: US 6,717,066 B2
(45) Date of Patent: Apr. 6, 2004

(54) ELECTRONIC PACKAGES HAVING MULTIPLE-ZONE INTERCONNECTS AND METHODS OF MANUFACTURE

(75) Inventors: Gilroy J. Vandentop, Tempe, AZ (US); Yuan-Liang Li, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 158 days.

(21) Appl. No.: 10/004,002

(22) Filed: Nov. 30, 2001

(65) Prior Publication Data

US 2003/0103338 A1 Jun. 5, 2003

(51) Int. Cl.[7] .............................................. H01L 23/48
(52) U.S. Cl. ...................... 174/260; 174/267; 361/772; 361/773; 257/690; 257/696; 257/786; 438/106; 438/108; 29/832; 29/840; 29/854
(58) Field of Search ................................ 361/767–769, 361/771–774, 760, 783, 803; 257/690, 692, 693, 696, 697, 780, 786; 439/69–71, 73; 174/260, 267; 438/106, 108, 125; 29/830, 832, 840, 854

(56) References Cited

U.S. PATENT DOCUMENTS

| | | | |
|---|---|---|---|
| 4,793,814 A | * 12/1988 | Zifcak et al. | 439/66 |
| 5,239,198 A | * 8/1993 | Lin et al. | 257/693 |
| 5,309,324 A | * 5/1994 | Herandez et al. | 361/734 |
| 5,321,583 A | 6/1994 | McMahon | 361/770 |
| 5,475,261 A | * 12/1995 | Tanizawa | 257/693 |
| 5,490,040 A | * 2/1996 | Gaudenzi et al. | 361/773 |
| 5,758,099 A | * 5/1998 | Grieco et al. | 710/301 |
| 5,796,169 A | * 8/1998 | Dockerty et al. | 257/780 |
| 5,923,083 A | 7/1999 | Autry et al. | 257/688 |
| 6,053,394 A | * 4/2000 | Dockerty et al. | 228/180.22 |
| 6,097,609 A | 8/2000 | Kabadi | 361/760 |
| 6,219,241 B1 | 4/2001 | Jones | 361/704 |
| 6,463,493 B1 | * 10/2002 | Hayes et al. | 710/301 |
| 2002/0065965 A1 | * 5/2002 | Sathe et al. | 710/100 |

OTHER PUBLICATIONS

Ma, L., et al., "Compliant Cantilevered Spring Interconnects for Flip–Chip Packaging", *2001 Electronic Components and Technology Conference*, 6 pages, (May 2001).
Ma, L., et al., "Novel Nanospring Interconnects for High–Density Applications", *2001 International Symposium on Advanced Packaging Materials*, 372–378, (Mar. 2001).
Naeemi, A., et al., "Sea of Leads: A Disruptive Paradigm for a System–on–a–Chip (SoC)", *ISSCC 2001/Session 17/TD Technologies and Measurement Techniques/17.7*, 280–281, (Feb. 2001).
Reed, H.A., et al., "Compliant Wafer Level Package (CWLP) With Embedded Air–gaps for Sea of Leads (SoL) Interconnections", 2001 IEEE, 151–153, (Jun. 2001).

* cited by examiner

*Primary Examiner*—John B. Vigushin
(74) *Attorney, Agent, or Firm*—Schwegman, Lundberg, Woessner & Kluth, P.A.

(57) ABSTRACT

To accommodate thermal stresses arising from different coefficients of thermal expansion (CTE) of a packaged or unpackaged die and a substrate, the package incorporates two or more different interconnect zones. A first interconnect zone, located in a central region of the die, employs a relatively stiff interconnect structure. A second interconnect zone, located near the periphery of the die, employs a relatively compliant interconnect structure. Additional interconnect zones, situated between the first and second interconnect zones and having interconnect structure with compliance qualities intermediate those of the first and second zones, can optionally be employed. In one embodiment, solder connections providing low electrical resistance are used in the first interconnect zone, and compliant connections, such as nanosprings, are used in the second interconnect zone. Methods of fabrication, as well as application of the package to an electronic assembly, an electronic system, and a data processing system are also described.

54 Claims, 6 Drawing Sheets

ELECTRONIC PACKAGES HAVING MULTIPLE-ZONE INTERCONNECTS AND METHODS OF MANUFACTURE

RELATED INVENTION

The present invention is related to the following invention which is assigned to the same assignee as the present invention:

Ser. No. 09/726,629 entitled "Solderless Electronics Packaging and Methods of Manufacture".

TECHNICAL FIELD OF THE INVENTION

The present invention relates generally to electronics packaging. More particularly, the present invention relates to an electronic package that includes an integrated circuit (IC) die or an IC package coupled to a substrate with multiple-zone interconnects, and to manufacturing methods related thereto.

BACKGROUND OF THE INVENTION

Integrated circuits (ICs) are typically assembled into electronic packages by physically and electrically coupling one or more ICs to a substrate made of organic or ceramic material. One or more IC packages can be physically and electrically coupled to a substrate such as a printed circuit board (PCB) or motherboard to form an "electronic assembly". The "electronic assembly" can be part of an "electronic system". An "electronic system" is broadly defined herein as any product comprising an "electronic assembly". Examples of electronic systems include computers (e.g., desktop, laptop, hand-held, server, etc.), wireless communications devices (e.g., cellular phones, cordless phones, pagers, etc.), computer-related peripherals (e.g., printers, scanners, monitors, etc.), entertainment devices (e.g., televisions, radios, stereos, tape and compact disc players, video cassette recorders, MP3 (Motion Picture Experts Group, Audio Layer 3) players, etc.), and the like.

In the field of electronic systems there is an incessant competitive pressure among manufacturers to drive the performance of their equipment up while driving down production costs. This is particularly true regarding the packaging of ICs, where each new generation of packaging must provide increased performance and reliability while generally being smaller or more compact in size. As market forces drive equipment manufacturers to produce electronic systems with increased complexity, performance, and reliability, and with decreased size, IC packaging accordingly also needs to support these requirements.

An IC substrate may comprise a number of metal layers selectively patterned to provide metal interconnect lines (referred to herein as "traces"), and one or more electronic components mounted on one or more surfaces of the substrate. The electronic component or components are functionally connected to other elements of an electronic system through a hierarchy of electrically conductive paths that include the substrate traces. The substrate traces typically carry signals that are transmitted between the electronic components, such as ICs, of the system.

Some ICs have a relatively large number of input/output (I/O) terminals (also called "lands"), as well as a large number of power and ground terminals or lands. I/O terminals are typically located near the periphery of the IC, whereas power supply terminals are typically located in a central region of the IC.

Surface mount technology (SMT) is a widely known technique for coupling ICs to a substrate. One of the conventional methods for surface-mounting an IC on a substrate is called "controlled collapse chip connect" (C4). In fabricating a C4 package, the electrically conductive terminals of an IC component are soldered directly to corresponding terminals on the surface of the substrate using reflowable solder bumps or balls. The C4 process is widely used because of its robustness and simplicity. However, C4 structures may not accommodate thermally induced stresses occurring during thermal cycling, particularly those arising from the coefficient of thermal expansion (CTE) mismatch between the die material and substrate material, especially at high densities of input/output (I/O) terminals on large ICs.

In addition to CTE mismatch problems arising within the die-to-package interconnect, CTE mismatch can also cause reliability problems at higher levels of IC packaging, such as between an IC package and a PCB substrate.

For the reasons stated above, and for other reasons stated below which will become apparent to those skilled in the art upon reading and understanding the present specification, there is a significant need in the art for IC packaging, whether of unpackaged or packaged dies, and methods of fabricating such IC packaging that can accommodate thermal stresses while still providing good mechanical and electrical connections between the IC terminals (or IC package terminals) and the substrate terminals.

DETAILED DESCRIPTION OF EMBODIMENTS OF THE INVENTION

In the following detailed description of embodiments of the invention, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that mechanical, chemical, electrical, and procedural changes may be made without departing from the spirit and scope of the present invention. The following detailed description is, therefore, not to be taken in a limiting sense, and the scope of the present invention is defined only by the appended claims.

The present invention provides solutions to thermal stress problems originating from the electromechanical interconnect between an IC or IC package and a substrate. Two or more interconnect zones are provided, and each interconnect zone uses interconnect structure having a different modulus of elasticity (M/E) and/or a different CTE to couple the IC or IC package to the substrate. Various embodiments are illustrated and described herein.

In one two-zone embodiment, an unpackaged IC is mounted to a package substrate using two different types of connectors. In a central zone of the IC, a first type of connector comprises solder bumps to provide good electrical qualities, including low resistance and low inductance. In a peripheral zone near the edge of the IC, a second type of connector comprises a relatively compliant structure, such as a nanospring connector, a sea of leads connector, or an interposer connector. While compliance is a primary characteristic of the second type of connector, it also has as good electrical qualities, including reasonably low resistance and inductance, as possible, considering its geometry, structure, and composition.

The term "compliant", as used herein, means readily deformable and/or movable under pressure along one or more axes of movement (i.e., in the X, Y, and/or Z directions). Examples of compliant materials and structures are provided herein and include, but are not limited to, nanospring connectors, sea of leads connectors, and interposer connectors.

By using relatively rigid connectors having good electrical qualities in the first zone, good power and ground connections between the IC and substrate are provided, thus ensuring good IC performance. By using relatively compliant connectors in the second zone, thermal stresses due to the CTE mismatch between the die material and the substrate material can be accommodated, thus increasing the package reliability.

In another embodiment, a packaged IC is mounted to a substrate, such as a PCB, using similar structures and methods to those used to mount an unpackaged IC to a substrate.

Figure 1:
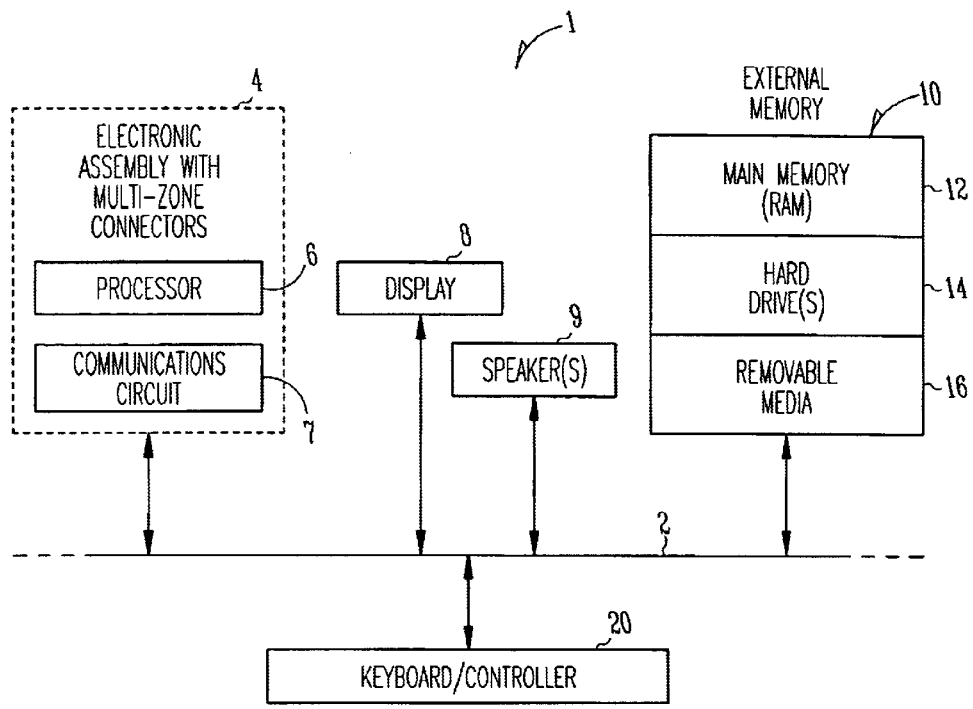
FIG. 1 is a block diagram of an electronic system incorporating at least one electronic assembly with a multiple-zone interconnect between an IC die and a substrate, in accordance with one embodiment of the invention.

FIG. 1 is a block diagram of an electronic system 1 incorporating at least one electronic assembly 4 with a multiple-zone interconnect between an IC die and a substrate, in accordance with one embodiment of the invention. Electronic system 1 is merely one example of an electronic system in which the present invention can be used. In this example, electronic system 1 comprises a data processing system that includes a system bus 2 to couple the various components of the system. System bus 2 provides communications links among the various components of the electronic system 1 and can be implemented as a single bus, as a combination of busses, or in any other suitable manner.

Electronic assembly 4 is coupled to system bus 2. Electronic assembly 4 can include any circuit or combination of circuits. In one embodiment, electronic assembly 4 includes a processor 6 which can be of any type. As used herein, "processor" means any type of computational circuit such as, but not limited to, a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

Other types of circuits that can be included in electronic assembly 4 are a custom circuit, an application-specific integrated circuit (ASIC), or the like, such as, for example, one or more communications circuits 7 to communicate with other components that are part of electronic system 1 (such as external memory 10), or that are external to electronic system 1 (such as the Internet), or for use in wireless devices like cellular telephones, pagers, portable computers, two-way radios, and similar electronic systems. The IC or ICs within electronic assembly 4 can perform any other type of function.

Electronic system 1 can also include an external memory 10, which in turn can include one or more memory elements suitable to the particular application, such as a main memory 12 in the form of random access memory (RAM), one or more hard drives 14, and/or one or more drives that handle removable media 16 such as floppy diskettes, compact disks (CDs), digital video disk (DVD), and the like.

Electronic system 1 can also include a display device 8, a speaker 9, and a keyboard and/or controller 20, which can include a mouse, trackball, game controller, voice-recognition device, or any other device that permits a system user to input information into and receive information from the electronic system 1.

Figure 2:
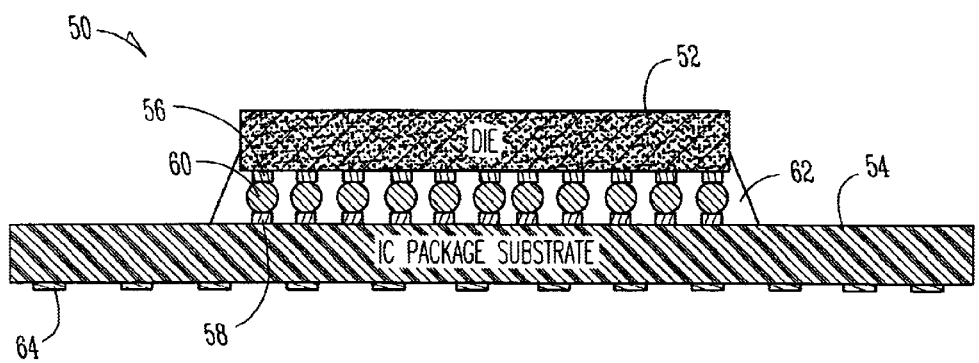
FIG. 2 shows a cross-sectional view of a single-zone interconnect between a die and a substrate in a prior art electronic package.

FIG. 2 shows a cross-sectional view of a single-zone interconnect between a die 52 and a substrate 54 in a prior art electronic package 50. The prior art electronic package 50 includes a die 52 having a plurality of signal and power supply terminals 56 on its lower surface. The package also includes substrate 54, e.g. an IC package substrate, having a plurality of signal and power supply terminals 58 on its upper surface and a plurality of signal and power supply terminals 64 on its lower surface.

Die 52 is mounted upon substrate 54 through a plurality of solder bumps or balls 60. A solder ball 60 electrically and physically connects a terminal 56 of die 52 to a corresponding terminal 58 of substrate 54. An underfill 62 is typically used to surround solder balls 60 to provide mechanical stability and strength.

It will be noted that the electronic package 50 of FIG. 2 has only a single type of connector, namely solder balls 60, to couple terminals 56 of die 52 to corresponding terminals 58 of substrate 54. The single type of connector persists across the entire opposing surfaces of die 52 and substrate 54. In other words, electronic package 50 can be characterized as having a single-zone interconnect.

As mentioned earlier in the section entitled Background of the Invention, electronic packages having a single-zone interconnect can experience significant reliability problems, when subjected to temperature changes, because of CTE mismatches between the material of the die 52 (typically silicon, or another low-dielectric material, either of which has a relatively low CTE) and that of the substrate 54 (typically a plastic or organic material, either of which has a relatively high CTE). Such problems can include deformed, cracked, and totally fractured connection joints, which in turn can subject the electronic package 50 to partial or catastrophic failure.

These problems are exacerbated in electronic packages that utilize certain technological advances in fabricating and packaging ICs, such as decreased bump pitches, the use of stiffer lead-free solder bumps, and the use of die materials having a lower dielectric constant than $SiO_2$ (resulting in reduced mechanical strength and/or adhesion strength). It is thus desirable to overcome these problems in order to manufacture electronic packages with higher reliability.

Figure 3:
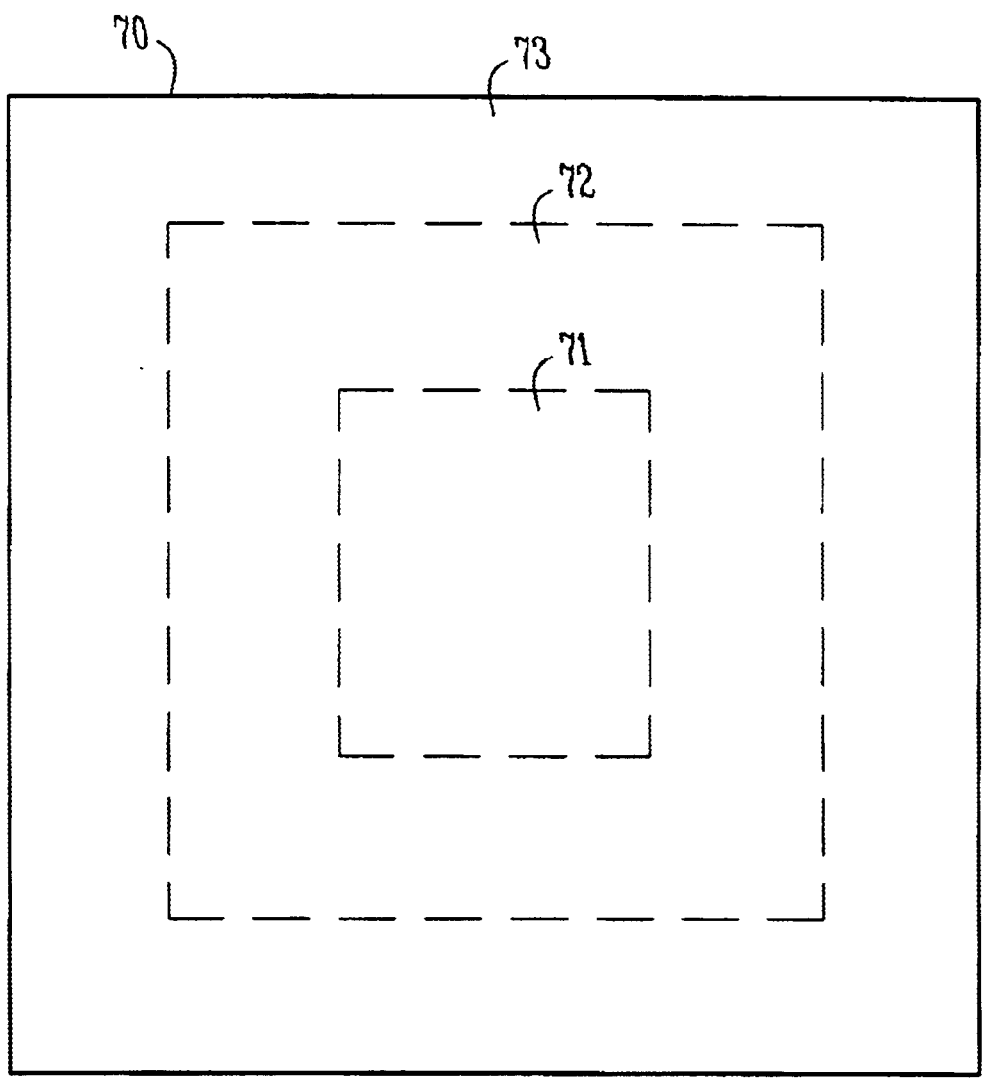
FIG. 3 illustrates a view of a representation of multiple interconnect zones on a die, in accordance with an embodiment of the invention.

FIG. 3 illustrates a view of a representation of multiple interconnect zones 71, 72, and 73 on a die 70, in accordance with an embodiment of the invention. Zone 71 is centrally located on a surface of die 70. Zone 73 is peripherally located. Zone 72 is located intermediate zones 71 and 73.

Although zones 71–73 are illustrated as having substantially rectangular boundaries, they could alternatively have boundaries of any geometric shape, including a free-form shape. Individually, they could also be of any suitable area and location. In general, the physical attributes, including shape, area, and location of zones 71–73 are chosen depending upon a number of factors, including the pitch, size, area, and location of power supply terminals and I/O terminals on the die surface; thermal, mechanical, and electrical properties of the die material, the substrate material, and the connectors; the size of the die; the performance specifications, electrical specifications, thermal specifications, and mechanical specifications of the die; the thermal and mechanical characteristics of the ambient environment surrounding the electronic package; fabrication costs; and other factors.

Although three zones 71–73 are illustrated in FIG. 3, more or fewer zones could be utilized. For example, in one embodiment the die is divided into only two zones, a first zone centrally located and including all or substantially all of the power supply terminals, and a second zone peripherally located and including all or substantially all of the I/O terminals.

Returning to the embodiment illustrated in FIG. 3, a first type of connector is used to connect to terminals (not shown) located in zone 71. Likewise, second and third types of connectors are used to connect to terminals (not shown) in zones 72 and 73, respectively. In general, the further a zone is from the die center (which constitutes a neutral point of zero CTE stress), the greater should be the compliance of the connector type within that zone. Thus, connectors in zone 71 can have a relatively low amount of compliance; i.e. they can be relatively stiff. Connectors in zone 72 have a relatively moderate amount of compliance. And connectors in zone 73 should have a relatively high amount of compliance; they should be relatively flexible.

Further details of the zones and of their corresponding connector types are provided in the description of FIG. 4 immediately below.

Figure 4:
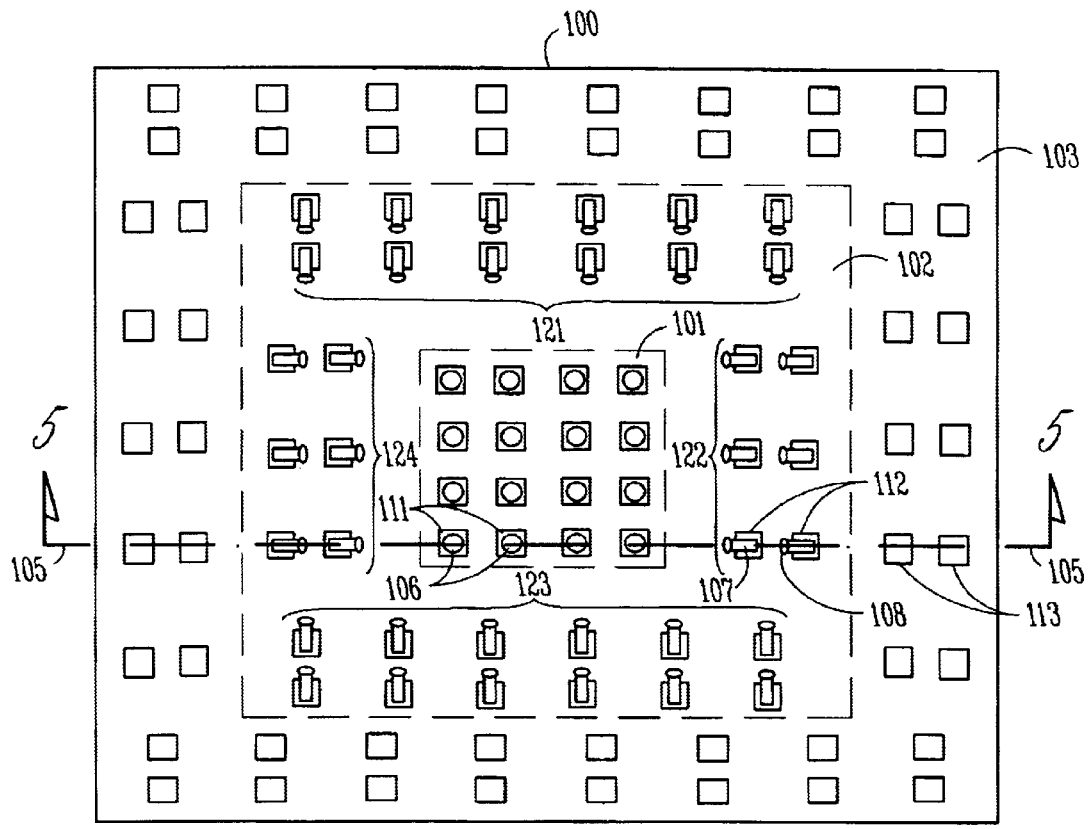
FIG. 4 illustrates a view of a representation of three different types of interconnect structures in multiple interconnect zones on a die, in accordance with an embodiment of the invention.

FIG. 4 illustrates a view of a representation of three different types of interconnect structures in multiple interconnect zones 101, 102, and 103, respectively, on a die 100, in accordance with an embodiment of the invention. Die 100 comprises a plurality of power and signal conductors (not shown) that terminate in lands or terminals 111–113 arranged on the surface of die 100.

Zone 101 is centrally located on a surface of die 100 and includes all or substantially all of the IC's power supply terminals 111. Zone 103 is peripherally located and includes all or substantially all of the IC's I/O terminals 113. Zone 102 is located intermediate zones 101 and 103, and it includes terminals 112, which can comprise power supply terminals and/or I/O terminals. In this example, all of the IC's terminals 111, 112, and 113 are disposed on one surface of die 100.

Zone 101 comprises a first type of connector that, in this embodiment, comprises solder bumps or solder balls 106 disposed on terminals 111. Solder balls 106 have relatively low electrical resistance and are excellent conductors of electricity. In addition, solder balls 106, when reflowed, form solder fillets that are relatively short and thin, thus minimizing inductance problems. This makes solder balls 106 ideal for connecting to the IC's power supply terminals. Although solder balls 106 are relatively stiff and have a relatively low CTE, the impact of these characteristics on thermal shear forces acting upon die 100 and its interconnect structure is minimized, because solder balls 106 are situated in a central region of the surface of die 100, where thermally induced stresses are minimal.

Figure 6:
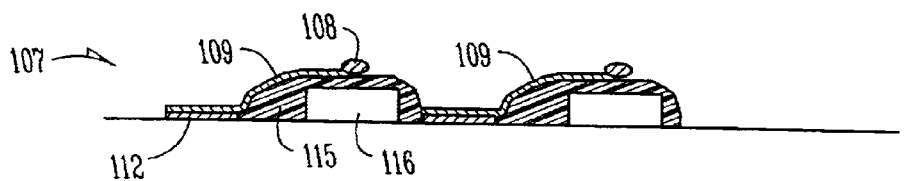
FIG. 6 illustrates an enlarged cross-sectional view of a sea of leads connector from a zone of the die shown in FIG. 5.

Zone 102 comprises a second type of connector that, in this embodiment, comprises "sea of leads" type connectors 107. "Sea of leads" connectors 107 are known in the art and are described, for example, in "Compliant Wafer Level Package (CWLP) With Embedded Air-Gaps for Sea of Leads (SoL) Interconnections"; H. A. Reed et al.; Interconnect Technology Conference, 2001; Proceedings of the IEEE 2001 International, 2001; Jun. 4–6, 2001; pages 151–153. One implementation of a sea of leads connector 107 is illustrated in FIG. 6, described further below.

Still referring to FIG. 4, each sea of leads connector 107 comprises a compliant electrically conductive element. In the embodiment illustrated in FIG. 4, the compliant electrically conductive element is implemented in the form of an elongated, flexible conductor having one end coupled to a terminal 112 and the other end coupled to a solder ball 108.

The sea of leads connectors 107 can be arranged in any suitable fashion within zone 102. In the embodiment shown in FIG. 4, the sea of leads connectors 107 are illustrated as having a raised portion, comprising solder ball 108, pointing generally in an inward direction away from the periphery of die 100. For example, group 121 of sea of leads connectors 107 are disposed along the upper portion of zone 102, with their raised portions generally pointing downward, away from the upper edge of die 100. Group 122 of sea of leads connectors 107 are disposed along the right-hand portion of zone 102, with their raised portions generally pointing to the left, away from the right-hand edge of die 100.

Similarly, groups 123 and 124 of sea of leads connectors 107 are disposed along the bottom and left-hand sides, respectively of zone 102, with their raised portions generally pointing upward or to the right, respectively, from the edge of die 100. Many other arrangements of sea of leads connectors 107 are possible. For example, they could all point in the same direction; half of them could point in one direction, and the other half could point in the opposite direction; they could each be angled towards or away from one point on the surface of die 100 such as the geometrical center of die 100; and so forth.

Figure 7:
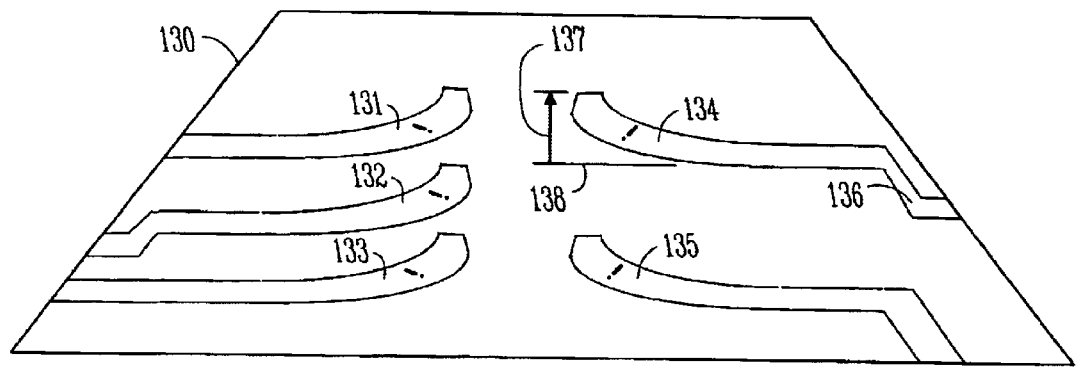
FIG. 7 illustrates an enlarged perspective view of several nanospring connectors, similar to those used to couple to corresponding terminals in a zone of the die shown in FIG. 5.

Zone 103 comprises a third type of connector. In this embodiment, lands or terminals 113 are to couple to "nanospring" type connectors (e.g. nanospring connectors 127, FIG. 5) on the substrate to which die 100 is to be attached. "Nanospring" connectors are known in the art and are described, for example, in "Novel Nanospring Interconnects for High-Density Applications"; L. Ma et al.; 2001 International Symposium on Advanced Packaging Materials; Chateau Elan, Braselton, Ga.; Mar. 11–14, 2001; pages 372–378. One implementation of a nanospring connector is illustrated in FIG. 7, described further below.

Figure 5:
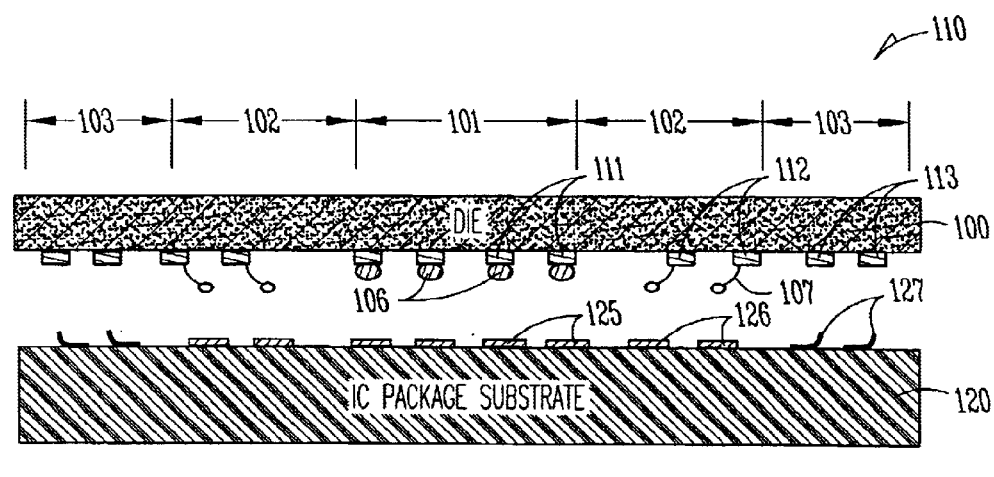
FIG. 5 illustrates a cross-sectional view of an IC package, including a cross-sectional view of the die shown in FIG. 4, taken along line 105 of FIG. 4.

FIG. 5 illustrates a cross-sectional view of an IC package 110, including a cross-sectional view of the die 100 shown in FIG. 4, taken along line 105 of FIG. 4. IC package 110 includes die 100 and IC package substrate 120. For illustrative purposes, die 100 and IC package substrate 120 are shown in position to be coupled together. Die 100 is shown inverted, in flip-chip orientation, with its terminals facing corresponding terminals of IC package substrate 120.

Each zone 101–103 of die 100 has a different type of connector to couple corresponding terminals within its zone. For example, in central zone 101, solder balls 106 on terminals 111 are to couple to corresponding terminals 125 of IC package substrate 120. In intermediate zone 102, sea of leads connectors 107 are to couple to corresponding terminals 126 of IC package substrate 120. And in peripheral zone 103, nanospring connectors 127 of IC package substrate 120 are to couple to corresponding terminals 113 of die 100.

Although in the embodiment illustrated in FIG. 5, solder balls 106 and sea of leads connectors 107 are on die 100, and nanospring connectors 127 are on IC package substrate 120, in other embodiments the different types of connectors can be positioned in any suitable manner, e.g. all could be on die 100, or all could be on IC package substrate 120, or they could be arranged in any combination of the above.

IC package 110 can form part of electronic assembly 4 shown in FIG. 1.

FIG. 6 illustrates an enlarged cross-sectional view of a sea of leads connector 107 from zone 102 of the die 100 shown in FIG. 5. Sea of leads connector 107 comprises an elongated, flexible conductor 109 having one end coupled to a terminal 112 of die 100 (the sea of leads structure shown in FIG. 6 is inverted with respect to that shown in FIG. 4) and the other end coupled to a solder ball 108. Conductor 109 is formed of any suitable conductive material, such as copper or aluminum. Except for the end of conductor 109 that is coupled to terminal 112, conductor 109 is supported by a support layer 115 of flexible, electrically insulating material, such as a plastic or polymer. A portion of support layer 115 overlies an air-gap 116. Air-gap 116 increases the effective compliance of sea of leads connector 107, making it and the electronic package of which it is a part, less subject to thermally and mechanically induced stresses.

Although, in FIG. 6, the sea of leads connector 107 comprises a solder ball 108, in other embodiments the sea of leads connector 107 need not comprise a solder ball 108. Other implementations of sea of leads connectors besides that shown in FIG. 6 are possible.

FIG. 7 illustrates an enlarged perspective view of several nanospring connectors 131–135, similar to nanospring connectors 127 used to couple to terminals 113 in zone 103 of the die 100 shown in FIG. 5. In this illustration, nanosprings 131–135 are formed on a surface of a substrate 130; however, they could alternatively be formed on a surface of a die.

Nanosprings are stress-engineered thin films patterned onto a suitable surface into tiny springs that curl up at one end due to a stress gradient along their lengths. They can provide a fine pitch, high density interconnect. The interconnect can be a solderless, sliding, friction contact with a target terminal surface, such as an I/O bonding pad. Because nanosprings are highly compliant, they can tolerate a relatively high degree of thermally and mechanically induced stresses compared with conventional interconnect structures.

A representative nanospring 134 is shown as being formed from or otherwise coupled to a conductor 136 on the surface of substrate 130. Before the tip of nanospring 134 is released during the fabrication process, it lies flat along dashed line 138. When nanospring 134 (along with nanosprings 131–133 and 135) is released during the fabrication process, its tip curls upwards to a certain height 137. As mentioned above, the compliant tips of nanosprings 131–135 can make suitable electrical contact with corresponding terminals without the need for an electrically conductive adhesive, such as solder.

Other implementations of nanospring connectors besides that shown in FIG. 7 are possible.

Figure 8:
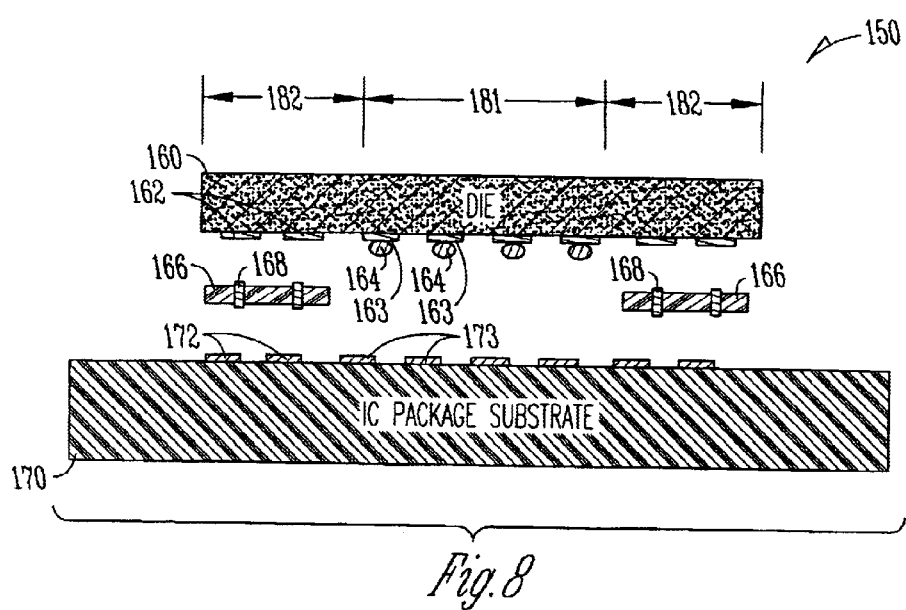
FIG. 8 illustrates a cross-sectional representation of an IC package comprising a die mounted on a substrate using two different zones of connectors, in accordance with an embodiment of the invention.

FIG. 8 illustrates a cross-sectional representation of an IC package 150 comprising a die 160 mounted on a substrate 170 utilizing two different zones 181–182 of connectors, in accordance with an embodiment of the invention.

Die 160 comprises a set of terminals 163 in a central zone 181. IC package substrate 170 comprises a corresponding set of terminals 173. Terminals 163 can be coupled to corresponding terminals 173 with a first type of connector, such as solder balls 164.

Die 160 also comprises a set of terminals 162 in a peripheral zone 182. IC package substrate 170 comprises a corresponding set of terminals 172. Terminals 162 can be coupled to corresponding terminals 172 with a second type of connector, such as compliant interposers 166. Each interposer 166 comprises a flexible support formed of an electrically insulating material, and a plurality of conductive elements 168 formed of electrically conductive material. Conductive elements 168 are in a pattern that substantially matches that of terminals 162 on die 160 and terminals 172 on IC package substrate 170, in terms of pitch and placement. Reference may be had to the Related Invention for further technical information.

In one embodiment of IC package 150, during assembly, die 160 is held against IC package substrate 170 by a suitable element that physically compresses them together to maintain electrical contact between corresponding terminals of die 160 and IC package substrate 170. Subsequently or concurrently, electronic package 150 is heated to solder reflow temperature and is then cooled, causing solder balls 164 to achieve sufficient electrical and mechanical contact between terminals 163 of die 160 and corresponding terminals 173 of IC package substrate 170.

If needed, a compression element can be used to permanently maintain sufficient electrical contact. The compression element can be any suitable mechanism for applying compression force, such as a spring or clamp, a resilient material, etc. The compression element could also be a non-resilient substance that is sandwiched between an integrated heat spreader (IHS) (not shown) and the top of die 160.

In the dual-zone embodiment of IC package 150 shown in FIG. 8, other suitable connector types could be substituted for those shown in zones 181 and/or 182, including those described elsewhere within this disclosure.

Figure 9:
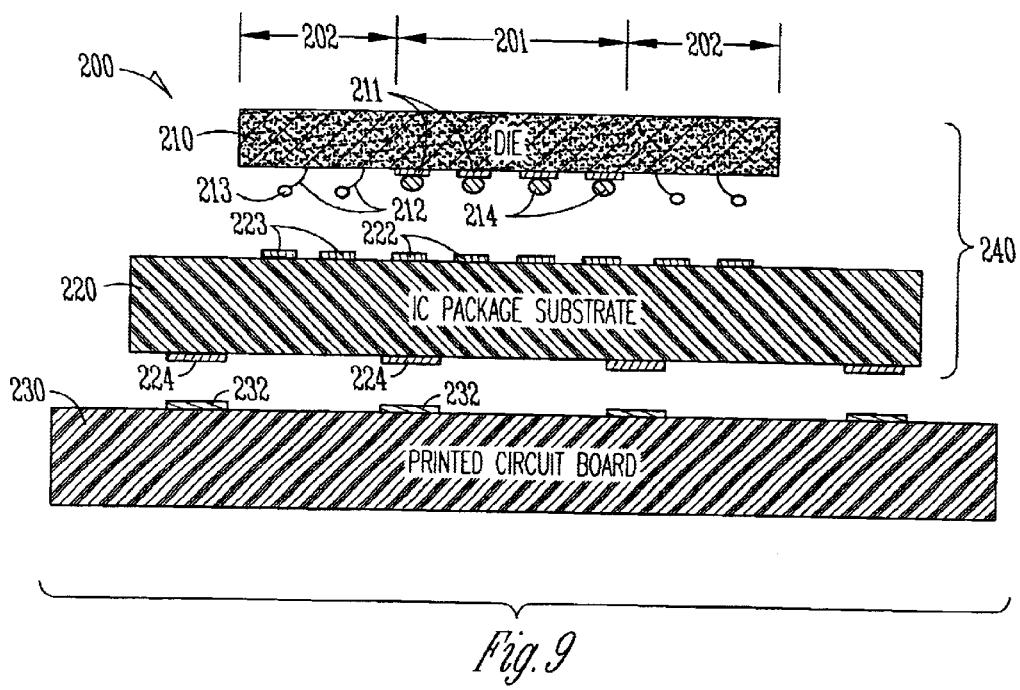
FIG. 9 illustrates a cross-sectional representation of an electronic assembly comprising a multiple-zone interconnect IC package mounted on a PCB, in accordance with an embodiment of the invention.

FIG. 9 illustrates a cross-sectional representation of an electronic assembly 200 comprising a multiple-zone interconnect IC package 240 (comprising die 210 and IC package substrate 220) mounted on a PCB 230, in accordance with an embodiment of the invention.

Die 210 comprises a set of terminals 211 in a central zone 201. IC package substrate 220 comprises a corresponding set of terminals 222. Terminals 211 can be coupled to corresponding terminals 222 with a first type of connector, such as solder balls 214.

Die 210 also comprises a set of compliant connectors in the form of sea of leads connectors 212 in a peripheral zone 202. IC package substrate 220 comprises a corresponding set of terminals 223. Sea of leads connectors 212 can be coupled to corresponding terminals 223 in any suitable manner. In the embodiment shown, each sea of leads connector 212 has a solder ball 213 to couple to a terminal 223.

In one embodiment of IC package 240, during assembly, die 210 is held against IC package substrate 220 by a suitable element that physically compresses them together to maintain electrical contact between corresponding terminals of die 210 and IC package substrate 220. Subsequently or concurrently, IC package 240 is heated to solder reflow temperature and is then cooled, causing solder balls 213 to achieve sufficient electrical and mechanical contact between terminals 212 of die 210 and corresponding terminals 223 of IC package substrate 220, and causing solder balls 214 to achieve sufficient electrical and mechanical contact between corresponding terminals 211 of die 210 and terminals 222 of IC package substrate 220.

In the dual-zone embodiment of IC package 240 shown in FIG. 9, other suitable connector types could be substituted for those shown in zones 201 and/or 202, including those described elsewhere within this disclosure.

IC package substrate 220 of IC package 240 comprises a plurality of terminals 224 on its lower surface. Terminals 224 can be aligned with and suitably mounted on corresponding terminals 232, which are disposed on an upper surface of PCB 230.

The electronic assembly 4 shown in FIG. 1 can be implemented in the same or similar form as electronic assembly 200 in FIG. 9.

Figure 10:
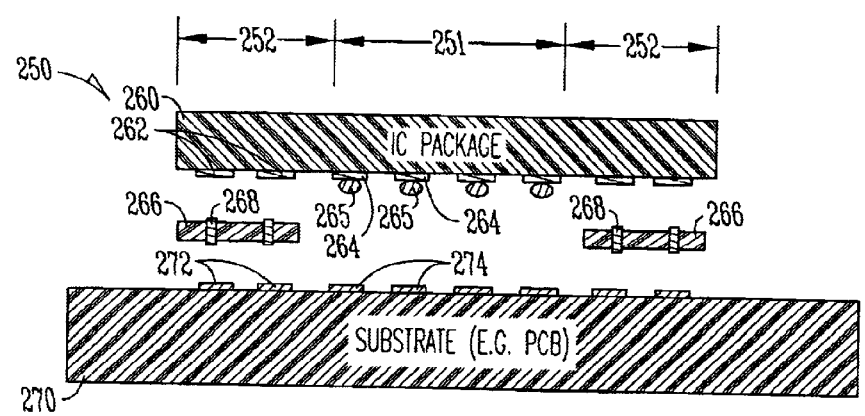
FIG. 10 illustrates a cross-sectional representation of an electronic assembly comprising a multiple-zone interconnect between an IC package and a PCB, in accordance with an embodiment of the invention.

FIG. 10 illustrates a cross-sectional representation of an electronic assembly 250 comprising a multiple-zone interconnect between an IC package 260 and a substrate, such as PCB 270, in accordance with an embodiment of the invention. Whereas the embodiments of the invention shown in FIGS. 4–5, 8, and 9 involve a multiple-zone interconnect between a die and an IC package substrate, the embodiment of FIG. 10 applies the teachings of the invention to a higher level of packaging integration, as will now be described.

IC package 260 comprises a set of terminals 264 in a central zone 251 of the interconnect region between IC package 260 and PCB 270. PCB 270 comprises a corresponding set of terminals 274 in central zone 251. Terminals 264 can be coupled to corresponding terminals 274 with a first type of connector, such as solder balls 265.

IC package 260 also comprises a set of terminals 262 in a peripheral zone 252. PCB 270 comprises a corresponding set of terminals 272 on its upper surface. Terminals 262 can be coupled to corresponding terminals 272 in any suitable manner. In the embodiment shown, compliant connectors in the form of interposer connectors 266, each having suitably positioned electrically conductive elements 268, are used to couple terminals 262 of IC package 260 to corresponding terminals 272 of PCB. 270.

In one embodiment of electronic assembly 250, during assembly, IC package 260 is held against PCB 270 by a suitable element that physically compresses them together to maintain electrical contact between corresponding terminals of IC package 260 and PCB 270. Subsequently or concurrently, IC package 260 is heated to solder reflow temperature and is then cooled, causing solder balls 265 to achieve sufficient electrical and mechanical contact between terminals 264 of IC package 260 and corresponding terminals 274 of PCB 270. If needed, a compression element can be used to permanently maintain sufficient electrical contact.

In the dual-zone embodiment of electronic assembly 250 shown in FIG. 10, other suitable connector types could be substituted for those shown in zones 251 and/or 252, including those described elsewhere within this disclosure.

Although, for ease of illustration, details are not shown of the internal interconnection between the die and IC package substrate of IC package 260, it should be understood that such interconnection could also be implemented as a multi-zone interconnect using techniques and concepts disclosed elsewhere within this disclosure. That is, multi-zone interconnections can be implemented at two or more different levels of packaging.

Several methods for fabricating an electronic package in accordance with at least one embodiment discussed above will now be described.

Figure 11:
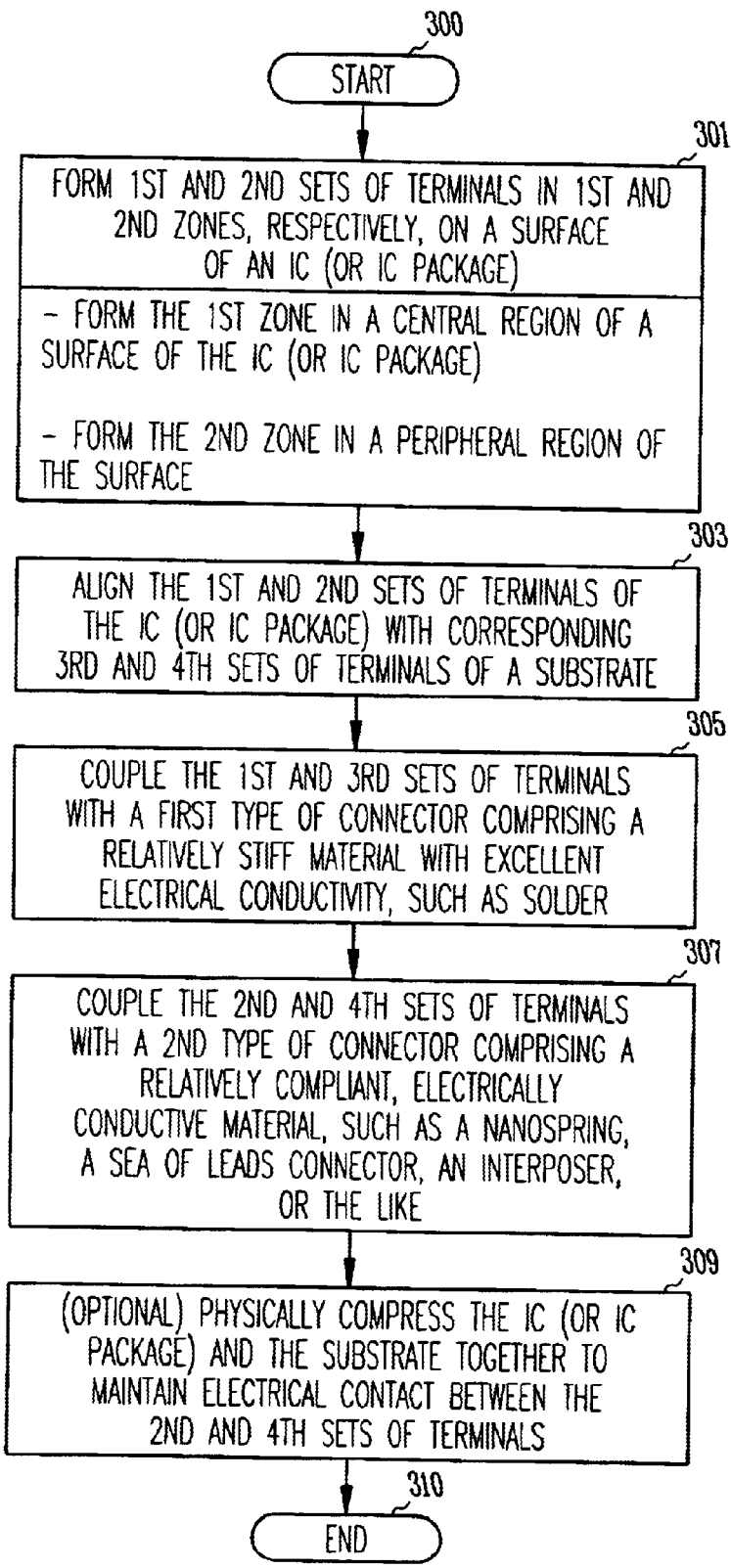
FIG. 11 is a flow diagram illustrating methods of mounting an IC or an IC package on a substrate, in accordance with embodiments of the invention.

FIG. 11 is a flow diagram illustrating methods of mounting an IC or an IC package on a substrate, in accordance with embodiments of the invention. The method begins at 300.

In 301, first and second sets of terminals are formed on a surface of an IC, in those embodiments wherein the multi-zone interconnect is between an IC and an IC package substrate. Or they are formed on a surface of an IC package substrate, in embodiments wherein the multi-zone interconnect is between an IC package and a higher level packaging substrate, such as a PCB. In certain embodiments, such terminals can be formed at more than one hierarchical level of a packaging structure, such as at the connection interface between an IC and an IC package substrate, as well as at the connection interface between an IC package and a PCB.

The first zone of terminals is formed in a central region of a surface of the IC (or the IC package). The second zone of terminals is formed in a peripheral region of the surface of the IC (or the IC package).

In 303, the first and second sets of terminals of the IC (or the IC package) are aligned with corresponding third and fourth sets of terminals of a substrate.

In 305, the first and third sets of terminals are coupled together with a first type of connector comprising a relatively stiff material with excellent electrical conductivity, such as solder. Solder reflow can be performed at any suitable stage, e.g. following 307 or 309.

In 307, the second and fourth sets of terminals are coupled together with a second type of connector comprising a relatively compliant, electrically conductive material, such as a nanospring, a sea of leads connector, an interposer connector, or the like.

In some embodiments, the second type of connector is a compressible element. The term "compressible", as used herein, means moveable at least in the Z direction (i.e. up and down). However, in other embodiments, the second type of connector need not be compressible, although it is still considered compliant if it is moveable in the X and/or Y directions.

In 309, if necessary, depending upon the type of compliant connectors used, and other design factors, the IC (or IC package) and the substrate are physically compressed together to maintain sufficient electrical contact between the second and fourth sets of terminals. The method ends at 310.

The operations described above with respect to the methods illustrated in FIG. 11 can be performed in a different order from those described herein.

Conclusion

The present invention provides for an electronic package, in several different embodiments, and for methods of manufacture thereof, that minimize thermal stresses arising because of CTE mismatch between die material (e.g. silicon) and the package substrate material (e.g. an organic material), or between a packaged IC and a substrate such as a PCB. An electronic system and/or data processing system that incorporates one or more electronic assemblies that utilize the present invention can be produced in various configurations that provide enhanced reliability, while maintaining good electronic performance, and such systems are therefore more commercially attractive.

In addition, because of the ability of electronic packages incorporating the present invention to tolerate relatively high amounts of thermal and mechanical stresses, it is possible that underfill can be eliminated, thus reducing fabrication costs.

As shown herein, the present invention can be implemented in a number of different embodiments, including an electronic package, an electronic assembly, an electronic system, a data processing system, methods for packaging an IC, and methods for mounting an IC package on a substrate. Other embodiments will be readily apparent to those of ordinary skill in the art. The elements, materials, geometries, dimensions, and sequence of operations can all be varied to suit particular packaging requirements.

For example, although several compliant types of connectors have been illustrated and described, namely nanospring connectors, sea of leads connectors, and interposer connectors, many other types of compliant connectors could also be used, provided they are suitable electrical conductors and have suitable thermal-mechanical qualities.

Also, while an embodiment of an IC is shown in which I/O signal traces are provided around the periphery and in which power supply traces are provided at the die core, the invention is equally applicable to embodiments wherein signal traces and power supply traces are provided anywhere on the die.

The various substrates described herein can be multilayered or a single-layered.

The various PCBs could be of any type, such as a card, a motherboard, or any other type of packaging element. The present invention is not to be construed as limited to any particular type of PCB.

The ICs of the embodiments illustrated and described herein can be of any type, including a processor.

Various embodiments of compliant connectors can be implemented. The structure, including types of materials used, dimensions, geometry, layout, electrical properties, and so forth, of both rigid and compliant connectors can be built in a wide variety of embodiments, depending upon the requirements of the IC package and/or electronic assembly of which the connector(s) forms a part. Further, the assembly operations can be varied by one of ordinary skill in the art to optimize the fabrication of the electronic package.

While a ball grid array (BGA) arrangement is illustrated in FIG. 8 for coupling IC 160 to IC package substrate 170, the present invention is not limited to use with a BGA arrangement, and it can be used with any other type of packaging technology, e.g. land grid array (LGA), chip scale package (CSP), or the like, where the herein-described features of the present invention provide an advantage.

The particular implementation of the invention is very flexible in terms of the orientation, size, number, and composition of its constituent elements. Various embodiments of the invention can be implemented using various combinations of rigid interconnects, compliant interconnects, die material, and substrate material to achieve the advantages of the present invention.

FIGS. 1 through 10 are merely representational and are not drawn to scale. Certain proportions thereof may be exaggerated, while others may be minimized. FIGS. 1 and 3–11 are intended to illustrate various implementations of the invention that can be understood and appropriately carried out by those of ordinary skill in the art.

While certain structures or operations have been described herein relative to "upper" or "lower", it will be understood that these descriptors are relative, and that they would be reversed if the IC, substrate, or package were inverted. Therefore, these terms are not intended to be limiting.

Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An electronic package comprising:
   a die comprising first and second sets of terminals disposed in first and second zones, respectively, of the die, the first zone being centrally located on a surface of the die;
   a substrate comprising third and fourth sets of terminals;
   a first type of connector to couple the first and third sets of terminals; and
   a second type of connector to couple the second and fourth sets of terminals.

2. The electronic package recited in claim 1, wherein the first and second sets of terminals are disposed on the surface of the die.

3. The electronic package recited in claim 1, wherein the second zone is peripherally located on the surface.

4. The electronic package recited in claim 1, wherein the first type of connector comprises solder.

5. The electronic package recited in claim 1, wherein the second type of connector comprises a compliant, electrically conductive material.

6. The electronic package recited in claim 1, wherein the second type of connector is from the group comprising a nanospring, a sea of leads connector, and an interposer.

7. The electronic package recited in claim 1, wherein the second type of connector comprises an interposer, and wherein the electronic package further comprises:
   an element to physically compress the die and the substrate together to electrically couple the die to the substrate.

8. The electronic package recited in claim 7, wherein the interposer comprises:
   a flexible support formed of electrically insulating material; and
   a plurality of elements formed of electrically conductive material.

9. The electronic package recited in claim 1, wherein the second type of connector comprises a compressible element to electrically couple the die to the substrate.

10. The electronic package recited in claim 1, wherein the die further comprises a fifth set of terminals disposed in a third zone of the die, wherein the substrate comprises a sixth set of terminals, and wherein the electronic package further comprises:

a third type of connector to couple the fifth and sixth sets of terminals.

11. The electronic package recited in claim 10, wherein the second and fifth sets of terminals are disposed on a surface of the die, wherein the second zone is peripherally located on the surface, and wherein the third zone is located on the surface between the first and second zones.

12. The electronic package recited in claim 10, wherein the first type of connector comprises solder, and wherein the second and third types of connectors comprise compliant material.

13. The electronic package recited in claim 10, wherein the first type of connector comprises solder, and wherein the second and third types of connectors are from the group comprising a nanospring, a sea of leads connector, and an interposer.

14. The electronic package recited in claim 10, wherein the second and third types of connectors are from the group comprising a nanospring and a sea of leads connector.

15. The electronic package recited in claim 1, wherein the second type of connector comprises a nanospring.

16. The electronic package recited in claim 1, wherein the second type of connector comprises a sea of leads connector.

17. The electronic package recited in claim 1, wherein the second type of connector comprises an interposer.

18. An electronic assembly comprising:
   an integrated circuit (IC) package comprising first and second sets of terminals disposed in first and second zones, respectively, of a surface of the IC package, the second zone being peripherally located on the surface;
   a substrate comprising third and fourth sets of terminals;
   a first type of connector to couple the first and third sets of terminals; and
   a second type of connector to couple the second and fourth sets of terminals and comprising a compliant, electrically conductive material.

19. The electronic assembly recited in claim 18, wherein the first zone is centrally located on the surface, and wherein the first type of connector comprises solder.

20. The electronic assembly recited in claim 18, wherein the second type of connector is from the group comprising a nanospring, a sea of leads connector, and an interposer.

21. The electronic assembly recited in claim 18, wherein the second type of connector comprises an interposer, and wherein the electronic assembly further comprises:
   an element to physically compress the IC package and the substrate together to electrically couple the IC package to the substrate.

22. The electronic assembly recited in claim 18, wherein the second type of connector comprises a nanospring.

23. The electronic assembly recited in claim 18, wherein the second type of connector comprises a sea of leads connector.

24. The electronic assembly recited in claim 18, wherein the second type of connector comprises an interposer.

25. An electronic system having at least one electronic assembly comprising:
   a die comprising first and second sets of terminals disposed in first and second zones, respectively, of a surface of the die, the first zone being centrally located on the surface;
   a substrate comprising third and fourth sets of terminals;
   a first type of connector, comprising solder, to couple the first and third sets of terminals; and
   a second type of connector to couple the second and fourth sets of terminals.

26. The electronic system recited in claim 25, wherein the second zone is peripherally located on the surface, and wherein the second type of connector comprises a compliant, electrically conductive material.

27. The electronic system recited in claim 25, wherein the second type of connector comprises a nanospring.

28. The electronic system recited in claim 25, wherein the second type of connector comprises a sea of leads connector.

29. The electronic system recited in claim 25, wherein the second type of connector comprises an interposer.

30. A data processing system comprising:
   a bus coupling components in the data processing system; and
   a processor coupled to the bus and including at least one electronic package comprising:
      a die comprising first and second sets of terminals disposed in first and second zones, respectively, of a surface of the die, the first zone being centrally located on the surface;
      a substrate comprising third and fourth sets of terminals;
      a first type of connector, comprising solder, to couple the first and third sets of terminals; and
      a second type of connector to couple the second and fourth sets of terminals.

31. The data processing system recited in claim 30, wherein the second zone is peripherally located on the surface, and wherein the second type of connector comprises a compliant, electrically conductive material.

32. The data processing system recited in claim 30 and further comprising:
   a display coupled to the bus; and
   external memory coupled to the bus.

33. The data processing system recited in claim 30, wherein the second type of connector comprises a nanospring.

34. The data processing system recited in claim 30, wherein the second type of connector comprises a sea of leads connector.

35. The data processing system recited in claim 30, wherein the second type of connector comprises an interposer.

36. A method comprising:
   forming first and second sets of terminals on a surface of an integrated circuit (IC);
   aligning the first and second sets of terminals with corresponding third and fourth sets of terminals of a substrate, the first and second sets of terminals being in first and second zones, respectively, of the IC, wherein the first zone is formed in a central region of the surface;
   coupling the first and third sets of terminals with a first type of connector; and
   coupling the second and fourth sets of terminals with a second type of connector.

37. The method recited in claim 36, including forming the second zone in a peripheral region of the surface.

38. The method recited in claim 36, wherein coupling the first and third sets of terminals with the first type of connector comprises using solder.

39. The method recited in claim 36, wherein coupling the second and fourth sets of terminals with the second type of connector comprises using a solderless, compliant, electrically conductive material.

40. The method recited in claim 36, wherein coupling the second and fourth sets of terminals with the second type of connector comprises using a connector from the group comprising a nanospring, a sea of leads connector, and an interposer.

41. The method recited in claim 36, wherein coupling the second and fourth sets of terminals with the second type of connector comprises physically compressing the IC and the substrate together.

42. The method recited in claim 36, wherein coupling the second and fourth sets of terminals with the second type of connector comprises using a nanospring.

43. The method recited in claim 36, wherein coupling the second and fourth sets of terminals with the second type of connector comprises using a sea of leads connector.

44. The method recited in claim 36, wherein coupling the second and fourth sets of terminals with the second type of connector comprises using an interposer.

45. A method comprising:
   aligning first and second sets of terminals of an integrated circuit (IC) package with corresponding third and fourth sets of terminals of a substrate, the first and second sets of terminals being in first and second zones, respectively, of the IC package;
   coupling the first and third sets of terminals with a first type of connector; and
   coupling the second and fourth sets of terminals with a second type of connector using a solderless, compliant, electrically conductive material.

46. The method recited in claim 45, including forming the first and second sets of terminals on a surface of the IC package.

47. The method recited in claim 46, including forming the first zone in a central region of the surface.

48. The method recited in claim 46, including forming the second zone in a peripheral region of the surface.

49. The method recited in claim 45, wherein coupling the first and third sets of terminals with the first type of connector comprises using solder.

50. The method recited in claim 45, wherein coupling the second and fourth sets of terminals with the second type of connector comprises using a connector from the group comprising a nanospring, a sea of leads connector, and an interposer.

51. The method recited in claim 45, wherein coupling the second and fourth sets of terminals with the second type of connector comprises physically compressing the IC package and the substrate together.

52. The method recited in claim 45, wherein coupling the second and fourth sets of terminals with the second type of connector comprises using a nanospring.

53. The method recited in claim 45, wherein coupling the second and fourth sets of terminals with the second type of connector comprises using a sea of leads connector.

54. The method recited in claim 45, wherein coupling the second and fourth sets of terminals with the second type of connector comprises using an interposer.

* * * * *

UNITED STATES PATENT AND TRADEMARK OFFICE
CERTIFICATE OF CORRECTION

PATENT NO. : 6,717,066 B2
DATED : April 6, 2004
INVENTOR(S) : Vandentop et al.

It is certified that error appears in the above-identified patent and that said Letters Patent is hereby corrected as shown below:

Title page,
Item [56], References Cited, OTHER PUBLICATIONS, "Naeemi A., et al.," reference, after "17/TD" insert -- : 3D --.

Signed and Sealed this

Twenty-first Day of December, 2004

JON W. DUDAS
*Director of the United States Patent and Trademark Office*